United States Patent [19]
Nance et al.

[11] Patent Number: 5,933,025
[45] Date of Patent: Aug. 3, 1999

[54] LOW VOLTAGE INTERFACE CIRCUIT WITH A HIGH VOLTAGE TOLERANCE

[75] Inventors: Scott S. Nance, Sunnyvale; Mohammad R. Tamjidi, Milpitas; Richard C. Li, Cupertino; Jennifer Wong, Fremont; Hassan K. Bazargan, San Jose, all of Calif.

[73] Assignee: Xilinx, Inc., San Jose, Calif.

[21] Appl. No.: 08/784,163

[22] Filed: Jan. 15, 1997

[51] Int. Cl.⁶ .............................................. H03K 19/0185
[52] U.S. Cl. ................................................ 326/81; 326/83
[58] Field of Search ................................. 326/27, 57, 58, 326/80, 81, 83, 86

[56] References Cited

U.S. PATENT DOCUMENTS

| | | | |
|---|---|---|---|
| 4,486,674 | 12/1984 | Neely | 307/473 |
| 4,963,766 | 10/1990 | Lundberg | 307/451 |
| 5,300,832 | 4/1994 | Rogers | 326/57 |
| 5,315,187 | 5/1994 | Cheng | 307/542.1 |
| 5,338,978 | 8/1994 | Larsen et al. | 307/443 |
| 5,387,826 | 2/1995 | Shay et al. | 326/83 |
| 5,418,476 | 5/1995 | Strauss | 326/58 |
| 5,444,397 | 8/1995 | Wong et al. | 326/81 |
| 5,451,889 | 9/1995 | Heim et al. | 326/81 |
| 5,467,031 | 11/1995 | Nguyen et al. | 326/81 |
| 5,532,621 | 7/1996 | Kobayashi et al. | 326/86 |
| 5,543,733 | 8/1996 | Mattos et al. | 326/81 |
| 5,552,723 | 9/1996 | Shigehara et al. | 326/86 |
| 5,629,634 | 5/1997 | Carl et al. | 326/27 |
| 5,684,415 | 11/1997 | McManus | 326/81 |
| 5,721,508 | 2/1998 | Rees | 326/81 |
| 5,731,714 | 3/1998 | Monk et al. | 326/83 |
| 5,736,869 | 4/1998 | Wei | 326/81 |

OTHER PUBLICATIONS

Altera Corporation, "A 3.3–V Programmable Logic Device that Addresses Low Power Supply and Interface Trends" by Rakesh Patel et al., Custom Integrated Circuits Conference (CICC), Santa Clara, California, May 5–8, 1997.

*Primary Examiner*—Jon Santamauro
*Assistant Examiner*—Don Phu Le
*Attorney, Agent, or Firm*—Edel M. Young; E. Eric Hoffman

[57] ABSTRACT

A low voltage interface circuit with a high voltage tolerance enables devices with different power supply levels to be efficiently coupled together without significant leakage current or damage to the circuits. One embodiment of the present invention comprises a tri-state control circuit, a data path, a reference voltage circuit, and an isolation circuit. The interface circuit provides a high impedance receive mode. In this mode, when a voltage is applied to the I/O pin of the interface circuit which is sufficiently greater than the interface circuit power supply voltage, the isolation circuit isolates the power supply from the I/O pin. The interface circuit also protects all of the transistors from gate to bulk, gate to source and gate to drain voltage drops of greater than a specified voltage, for example 3.6V for a nominal 3V power supply when up to 5.5V is being externally applied to the I/O pin. In high impedance mode when the externally applied voltage at the I/O pin is sufficiently below the interface circuit supply voltage, the isolation circuit is driven to approximately the interface circuit supply voltage. In low impedance mode the isolation circuitry is disabled and the logic level at the data terminal is transmitted to the I/O pin. One embodiment of the present invention provides a buffered data path from the data terminal to the I/O pin.

7 Claims, 2 Drawing Sheets

LOW VOLTAGE INTERFACE CIRCUIT WITH A HIGH VOLTAGE TOLERANCE

FIELD OF THE INVENTION

This invention relates to the field of integrated circuits, and more specifically to digital logic input/output terminal circuits for interfacing logic circuits with other integrated circuit chips having more than one power supply level.

BACKGROUND OF THE INVENTION

When two digital logic devices having different power supply levels are coupled together, an interface circuit is generally required to prevent damage to transistors in the device having the lower power supply level. The interface circuit should also minimize leakage current and prevent latch-up.

For a given power supply voltage, the electric field strength, e.g. the change in voltage per unit length, that transistors are exposed to increases as the size of the transistors is reduced. Digital semiconductor devices have typically been powered by 5V supplies. The maximum electric field tolerance can be a limiting factor on the minimum transistor size. For example, a typical maximum gate oxide field strength for silicon dioxide gates is about 3 megavolts per centimeter. High electric fields inside a transistor can reduce the mean time to failure, and can destroy transistors when an electric field exceeds the breakdown value for a given material in a transistor, such as the gate oxide in CMOS devices.

To reduce the minimum transistor size imposed by the electric field, certain types of digital logic devices including CMOS devices are now powered with a 3.3V supply rather than a 5V supply. However, these 3.3V digital logic devices must often be connected to logic devices that operate with 5V supplies, such as, for example, TTL devices. Absent some form of protection, the 5V TTL signals can damage the 3.3V digital logic devices.

Programmable devices typically include pins that can be used for input or output signals depending upon how the device is programmed. These pins are called I/O pins or I/O terminals. An interface structure must be provided between the I/O pin and the internal portions of the programmable device. The interface structure operates in two modes: input pin mode and output pin mode. The interface structure connects to a DATA OUT line for receiving a data-out signal from the internal portions of the device. The interface structure connects to a DATA IN line for sending a data-in signal to the internal portions of the device. When the I/O pin is being used as an output pin, the interface structure buffers the data-out signal and applies it to the I/O pin. When the I/O pin is being used as an input pin, the interface structure places all output buffer drivers into a tristate mode, thus disconnecting them from the I/O pin so that an input signal applied by an external source to the I/O pin does not conflict with a signal on the DATA OUT line. The input signal is then typically buffered and applied to the DATA IN line.

A 3.3V device can safely drive its own I/O pin when the I/O pin is being used for output. However, when the I/O pin of a 3.3V device is being driven by a neighboring 5V device, the 3.3V device must include protection circuits attached to the I/O pin. One prior art approach to protecting 3.3V digital logic circuits is to provide diodes at the power supply of the 3.3V device to limit the maximum voltage at the I/O pin common to the low and high voltage devices. In these devices when an external voltage is applied to an I/O pin that is sufficiently greater than the power supply voltage, the power supply diode turns on and draws current. This approach has a drawback of creating large leakage currents and increasing the power dissipation. Other approaches to providing an interface between digital logic devices with different voltage tolerance levels suffer from a variety of drawbacks. Some require a 5V power supply, others reduce the noise immunity of the circuit and increase the vulnerability of the circuit to latch-up, and still others require costly fabrication processes to produce a plurality of types of transistors of the same polarity with different threshold levels. Thus an improved low voltage I/O circuit with a high voltage tolerance that avoids these and other prior art problems is needed.

SUMMARY OF THE INVENTION

The present invention provides a low voltage interface circuit with a high voltage tolerance. The present invention enables devices with different power supply levels to be efficiently coupled together without damage to the circuits of the low voltage device and without significant leakage current. By minimizing the gate oxide voltage drop in any one transistor, the present invention allows a single thinner gate oxide to be used in the interface circuit. Yet the same process technology is used for the interface circuit as is used for the rest of the device, so manufacturing cost is kept low.

One interface circuit of the present invention comprises a high impedance control circuit, a data path, a reference voltage circuit, and an isolation circuit. The circuit operates in two modes: input and output. Setting the TS terminal to a high logic level places the interface circuit into the receive or input mode and disables the output drivers.

Setting the TS terminal to a low logic level places the interface circuit into the transmit or output mode and enables the output drivers. In output mode high voltage protection structures are off. The logic level at a DATA OUT terminal is transmitted to the I/O pin. One embodiment of the present invention provides a buffered data path from the data terminal to the I/O pin.

When the circuit is in input mode, the output drivers are in a high impedance mode (the DATA OUT terminal is isolated from the I/O pin) and protection structures for protecting the device from the higher voltage external signal applied to the I/O pin are operating. In this input mode, when a voltage sufficiently greater than the internal power supply voltage is applied to the I/O pin, the isolation circuit isolates the internal power supply from the I/O pin. The interface circuit also protects transistors from gate to bulk, gate to source and gate to drain voltage drops. In a 3.3 volt circuit tolerant to 5.5 volt input signals, voltage drops of greater than 3.6V at a single transistor are prevented. The present invention thereby protects the interface circuit transistors from damage by high voltages at the I/O pin and avoids the large leakage currents of prior art circuits that have forward bias diodes at the power supply of the lower voltage circuit. In the input mode, when the externally applied voltage at the I/O pin is sufficiently below the interface circuit supply voltage, the isolation circuit is driven to approximately VCC of the chip (3.3V), protecting the internal gate oxides from voltage differences greater than 3.6V. The interface circuit of the present invention can be used to couple circuits that have different power supply and logic levels as long as the ratio of voltage levels is not greater than 2:1. For example, the present invention can be used in a semiconductor device with a 2.5V power supply to couple it to a device with a 3.3V power supply.

A reference voltage approximately half the internal supply voltage protects the isolation circuit, which in turn protects internal structures from the high voltage. In one embodiment of the present invention the reference voltage circuit comprises a transistor stack. The isolation circuit includes an N-well driven by a pull-up transistor coupled to the I/O pin. The N-well is actively driven by transistor pull-ups to the internal supply voltage or the I/O pin voltage depending on the operating conditions.

DETAILED DESCRIPTION OF THE INVENTION

Figure 1:
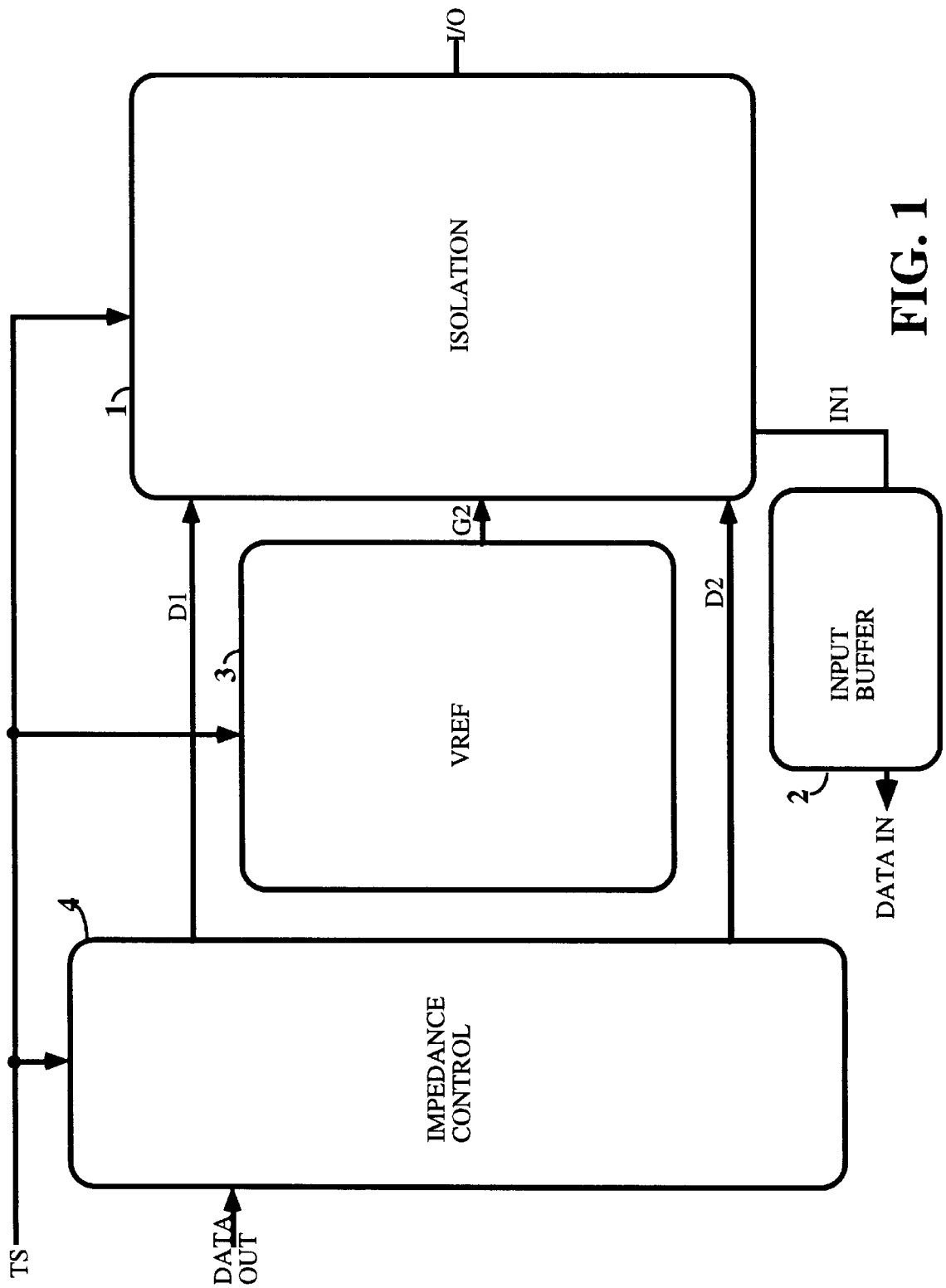
FIG. 1 is a block diagram of the present invention.

FIG. 1 shows a block diagram of circuits that implement the invention. An I/O pin can be used for either input or output. The structure must include output drivers for providing pullup and pulldown signals when the I/O pin is used as an output pin.

When the I/O pin is used for input and may supply a higher voltage than the output drivers and other internal structures are designed for, these output drivers and other structures must be protected. When the I/O pin voltage is higher than the internal supply voltage (VCC), isolation structure 1 shifts the level of the I/O signal, generating an input signal IN1 (which is buffered by input buffer 2 to generate the DATA IN signal). In an embodiment for which the internal voltage is 3.3 volts and a possible external voltage applied to I/O is as great as 5.5 volts, all transistors in isolation structure 1 are protected from a voltage drop of greater than 3.6 volts. To accomplish the protection, an intermediate reference voltage G2 is generated by reference voltage generating circuit 2 and used in isolation structure 1 to limit voltage drops.

Impedance control circuit 4 receives a DATA OUT signal and is controlled by tristate control signal TS to generate pullup and pulldown drive signals D1 and D2 used by isolation circuit 1 to generate an output signal. When the I/O pin is being used as an output pin, tristate control signal TS enables impedance control circuit 4 to generate high and low drive signals to drive the I/O pin. FIG. 1 shows two lines for carrying drive signals D1 and D2. These two signals in combination with the tristate control signal TS determine whether a logic low, logic high, or high impedance signal is presented by isolation structure 1 to the I/O pin.

Isolation Structure 1

Figure 2:
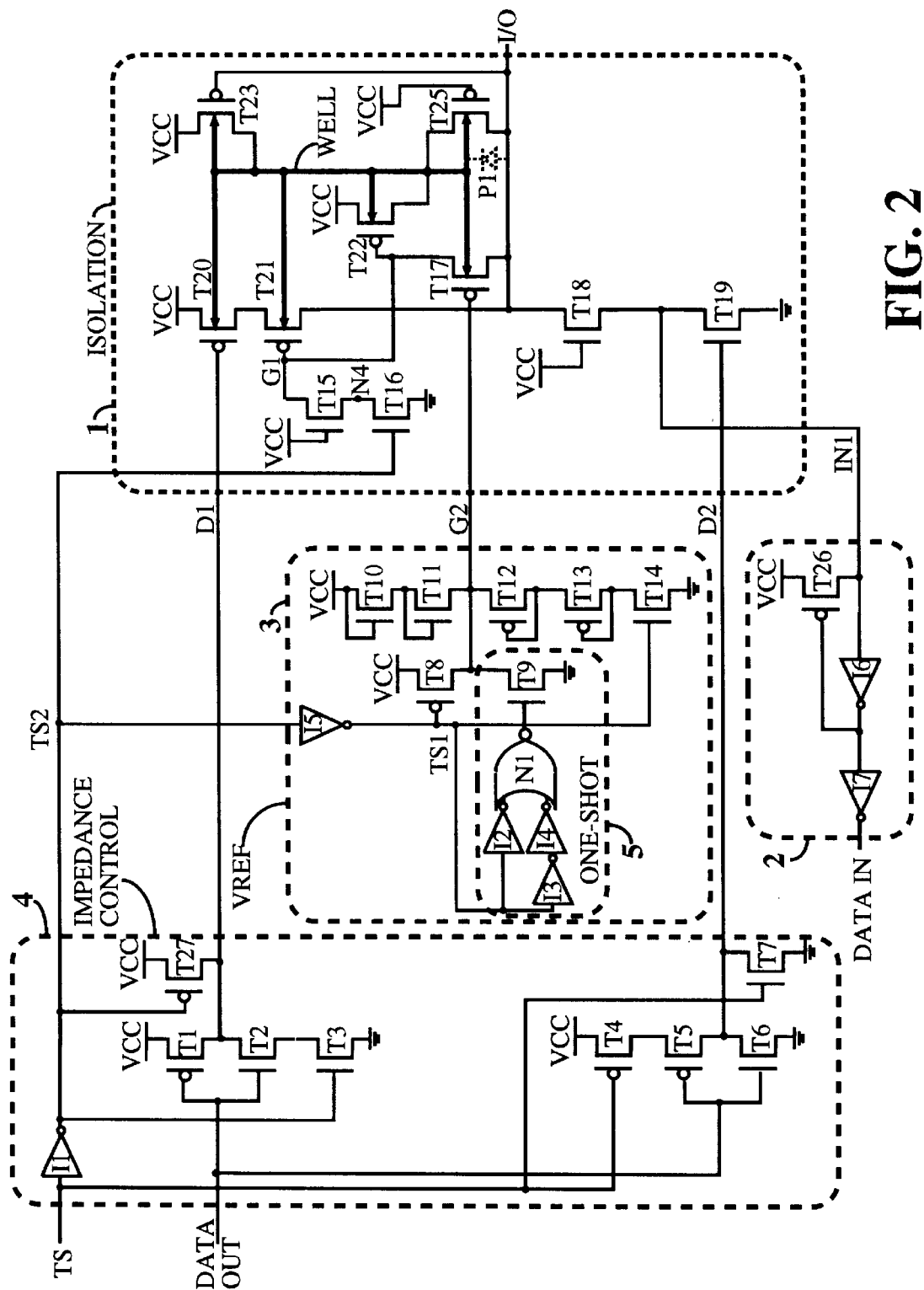
FIG. 2 illustrates one embodiment of the present invention low voltage interface circuit with a high voltage tolerance.

FIG. 2 shows a preferred embodiment of the invention. Tristate control signal TS determines whether the interface circuit is in transmit mode for using the I/O pin as an output pin (TS is low) or in receive mode for using the I/O pin as an input pin (TS is high). The DATA OUT line provides a data output signal for applying to the I/O pin in output mode. The DATA IN line receives a data input signal from the I/O pin when in input mode.

In transmit mode the isolation circuitry which enables the I/O pin to tolerate voltages greater than the VCC supply voltage is disabled. In receive mode, the output buffers are disabled and the isolation circuitry is enabled.

Isolation structure 1 includes PMOS pullup transistor T20 and NMOS pulldown transistor T19 for providing the output signal when the I/O pin is being used as an output pin. Transistors T20 and T19 must be protected when the I/O pin is used as an input pin and carries a voltage up to 5.5 volts. Thus, isolation transistors T21 and T18 are provided. Transistor T18 has its gate connected to VCC (3.3 volts) and thus the voltage at the source of T18 (at line IN1) is no more than VCC minus one NMOS threshold drop (or about 3.3–0.7= 2.6 volts). Thus neither transistor T19 nor inverter I6 (in input buffer 2) will experience damaging voltage levels.

Control of transistor T21 is more complex. When the I/O pin voltage is high (5.5 volts), transistor T21 must prevent current from flowing from the I/O pin to the VCC terminal. Thus when the I/O pin voltage is potentially 5.5 volts (when the I/O pin is an input pin), the gate voltage on PMOS transistor T21 must be sufficiently high to turn off transistor T21 (no lower than one threshold below the I/O pin voltage or about 4.8 volts). Node G1 is raised to the voltage of the I/O pin through transistor T17. Thus transistor T17 must be turned on. But transistor T17 may not be turned on by using a voltage low enough to stress the gate oxide of transistor T17. An intermediate voltage must be used to turn on transistor T17. When the voltage at the I/O pin is one P-channel threshold above G2, transistor T17 is on, and pulls the voltage at G1 to the I/O pin voltage. Reference voltage circuit 3 provides this intermediate voltage, approximately VCC/2, as discussed below. Transistor T21 is controlled during output mode by transistor T16, which pulls node G1 to 0 volts in output mode. Transistor T16, having a terminal connected to 0 volts (ground) must also be protected from the high I/O pin voltage during input mode. Transistor T15 provides this protection. In input mode node G1 is potentially 5.5 volts. The gate of transistor T15 is about 3.3 volts, an acceptable difference, and node N4 is one threshold below that, or about 2.6 volts. Thus transistor T16 does not experience excessive stress. Transistor T19 is protected in the same manner by transistor T18. In transmit mode (the I/O pin is an output pin) node TS1 is at a low logic level which turns on PMOS transistor T8 and turns NMOS transistor T14 off. With T8 on and T14 off, node G2 is at a high logic level which turns PMOS transistor T17 off.

In order for the chip to tolerate 5.5 volts at the I/O pin, the N-well voltage for the P-channel transistors connected to the I/O pin (labeled WELL in FIG. 2) must be equal to or higher than the voltage on the I/O pin. This is because a parasitic diode exists between each of the P-type drains of transistors T20, T21, T22, T23, T17 and T25 and the N-well in which these drains are formed. If current continues to flow through these parasitic diodes, there will be excessive power dissipation and the transistors will not function properly. Thus it is important that WELL not be connected in the conventional manner to VCC. When the voltage difference from the I/O pin to WELL is more than one threshold voltage drop, parasitic diode P1 (between the drain of T17 or T25 and WELL) turns on and raises the voltage of WELL to within one threshold voltage drop of the I/O pin voltage. For more positive pullup, when the I/O pin voltage is more than one P-channel threshold voltage above the internal VCC voltage, transistor T25 turns on and pulls WELL to the I/O pin voltage. Driving WELL with a transistor improves the noise immunity and reduces the vulnerability to latch-up compared to circuits that allow the N-well to be charged only through a parasitic diode. Driving WELL with a transistor also contributes to the fast switching speed of the circuit.

The WELL voltage is controlled in other situations also. When the I/O pin voltage is more than one threshold below VCC, transistor T23 turns on and pulls WELL to VCC. When the I/O pin is being used as an output pin, node G1 is pulled low by transistor T16, and transistor T22 turns on and pulls WELL to VCC. Thus the WELL voltage remains sufficiently high to prevent damage to the isolation transistor gate oxides and avoids forming a current path from a high I/O pin to VCC.

Input Buffer 2

A simple input buffer 2 comprises inverters I6 and I7 and pullup transistor T26. When the I/O pin voltage is 0 volts, the signal IN1 supplied by isolation circuit 1 has a voltage of 0 volts. When the I/O pin voltage is between about 2.6 volts and 5.5 volts, the signal IN1 has a voltage of VCC−Vt or about 2.6 volts in the embodiment discussed above. A voltage of 2.6 volts will be recognized by inverter I6 as a high logic level, but may cause some DC current flow through inverter I6. To eliminate this DC current flow, pull-up transistor T26 is turned on by the low output voltage from inverter I6 and pulls the voltage at IN1 to VCC. The size of transistor T26 is selected so that a switching I/O pin signal overrided the VCC value placed on the input terminal of inverter I6. Inverter I7 provides further buffering and brings the DATA IN signal to the same polarity as the I/O pin signal.

Reference Voltage Circuit 3

Reference voltage circuit 3 provides an intermediate voltage to protect isolation structure 1. In transmit mode, when the I/O pin is used as an output pin, TS is low, so TS1 is low, and transistor T8 is on, pulling G2 to a high voltage and turning off transistor T17.

In the receive mode (when the I/O pin is used as an input pin), terminal TS and node TS1 are at a high logic level. Under steady state conditions, when TS1 is at a high logic level, PMOS transistor T8 is off and NMOS transistor T14 is on. When transistor T14 is on, a transistor stack, comprising transistors T10, T11, T12, T13 and T14, is enabled and sets the reference voltage at node G2. The gates of transistors T10–T13 are coupled to their drains. Thus these transistors are always on and each provides a threshold voltage drop. Thus when T14 is on, the reference voltage on line G2 is approximately VCC/2. The high TS signal (low TS2 signal) turns off transistor T16, allowing node G1 to be driven by the I/O pin through transistor T17. The intermediate voltage at node G2 protects transistor T17 from having greater than 3.6V between its gate and its source when the I/O pin is externally driven to 5V. The presence of the intermediate reference voltage also contributes to the fast switching capability of the circuit between the high and low impedance modes.

An optional one-shot pulse generator improves the recovery time of the circuit when switching from data transmission mode (the I/O pin is an output pin) to the high impedance tri-state receive mode (the I/O pin is an input pin). The one-shot circuit 5 responds to the high-going TS1 signal. The one-shot circuit includes transistor T9 which is briefly turned on by the high signal from NOR gate N1 that exists only when inverters I2 and I3 have switched and inverter I4 has not yet switched. Transistor T9 briefly pulls down node G2, turning on transistor T17 fully, and applying the voltage on the I/O pin to node G1. Transistors T10 through T13 are preferably weak transistors in order to minimize current flow from VCC to ground in input mode. Thus when transistor T14 has turned on, transistors T12 and T13 will pull G2 from VCC to VCC/2 relatively slowly. Using transistor T9 to pull down node G2 reduces the turn-on time of PMOS transistor T17. One-shot circuit 5 pulls the G2 node low momentarily. This must not be a steady state condition because the I/O pin voltage may be 5.5 volts and the ground voltage supplied by transistor T9 is 0 volts. This 5.5-volt difference can destroy the thin oxide of transistor T17 used in the low-voltage process of the 3.3 volt chip. After a brief period, the voltage at node G2 is pulled to approximately VCC/2 by the transistor stack.

Impedance Control Circuit 4

In impedance control circuit 4, transistors T1, T2 and T3 form a first data-out pre-driver buffer. Similarly transistors T4, T5 and T6 form a second data-out pre-driver buffer. The pre-driver buffers are controlled by the tri-state terminal TS. When the I/O pin is an input pin (receive mode), a high TS logic level turns off PMOS transistor T4 and the low TS2 level turns off NMOS transistor T3. When transistors T3 and T4 are off, the input buffers comprising T1, T2, T3 and T4, T5, T6 are off. The high TS level (low TS2 level) turns on transistors T27 and T7, thus providing a high D1 signal and a low D2 signal. Thus when the I/O pin is an input pin, transistors T20 and T19 are off.

When the I/O pin is used as an output pin, tristate control signal TS is low. Transistors T3 and T4 are on and transistors T27 and T7 are off. Impedance control circuit 4 generates either a low pullup signal on line D1 in response to a high DATA OUT signal, or a high pulldown signal on line D2 in response to a low DATA OUT signal. In isosolation circuit 1, the low TS signal produces a high TS2 signal which turns on transistor T16, and since transistor T15 is always on, transistor T16 pulls node G1 to ground, turning transistor T21 hard on. If D1 is low (DATA OUT is high), transistor T20 is on, applying VCC to the I/O pin. If D2 is high (DATA OUT is low), transistor T19 is on. pulling the I/O pin to ground. Therefore, a low logic level input signal at the DATA OUT terminal produces a low logic level output signal at the I/O pin.

The present invention interface circuit can be fabricated using NMOS transistors having a single turn-on threshold voltage and PMOS transistors having a single turn-on threshold voltage. This reduces the cost of fabrication of the present invention over prior art circuits that require NMOS and PMOS transistors having different turn-on threshold voltages. While FIG. 2 shows an N-well technology embodiment, it is understood that the present invention can also be created using other technologies, for example, a dual-well technology.

Thus a low voltage interface circuit with a high voltage tolerance has been described. Although the present invention has been described with respect to certain specific embodiments, it will be clear to those skilled in the art that the inventive features of the present invention are applicable to other embodiments as well, all of which are intended to fall within the scope of the present invention.

We claim:

1. An interface circuit that is configurable to form an input circuit or an output circuit of an integrated circuit that operates in response to a positive supply voltage and a ground supply voltage, the interface circuit comprising:

an input/output (I/O) pin for providing a connection to an external circuit;

a pull-up structure for pulling up a voltage on said I/O pin;

a pull-down structure for pulling down a voltage on said I/O pin;

an impedance control circuit for providing control signals to the pull-up and pull-down structures, wherein the control signals disable the pull-up and pull-down structures when the interface circuit is configured as an input circuit, and wherein the control signals enable one of the pull-up and pull-down structures and disable the other one of the pull-up and pull-down structures when the interface circuit is configured as an output circuit;

a pull-up protection structure for protecting said pull-up structure from a voltage on said I/O pin greater than the positive supply voltage when the interface circuit is configured as an input circuit;

a pull-down protection structure for protecting said pull-down structure from a voltage on said I/O pin greater than the positive supply voltage when the interface circuit is configured as an input circuit;

a reference voltage circuit for providing an intermediate voltage to said pull-up protection structure when the interface circuit is configured as an input circuit, the intermediate voltage being less than the positive supply voltage and greater than a ground supply voltage, the intermediate voltage enabling the pull-up protection structure to protect the pull-up structure from voltages on the I/O pin that are greater than the positive supply voltage;

wherein said pull-up structure comprises:

a first PMOS transistor having a source coupled to receive the positive supply voltage, a drain coupled to the pull-up protection structure, and a gate coupled to receive a control signal from the impedance control circuit;

a second PMOS transistor having a source coupled to the drain of the first PMOS transistor and a drain coupled to the I/O pin;

voltage control circuitry coupled to a gate of the second PMOS transistor;

said pull-down structure comprises an NMOS transistor having a source coupled to receive the ground supply voltage, a drain coupled to the pull-down protection structure, and a gate coupled to receive a control signal from the impedance control circuit; and wherein the voltage control circuitry comprises:

a third PMOS transistor coupled between the gate of the second PMOS transistor and the I/O pin, the third PMOS transistor having a gate coupled to the reference voltage circuit, wherein the third PMOS transistor receives the intermediate voltage from the reference voltage circuit when the interface circuit is configured as an input circuit;

a third NMOS transistor having a drain connected to the gate of the second PMOS transistor, and a gate coupled to receive the positive supply voltage; and a fourth NMOS transistor having a drain connected to a source of the third NMOS transistor, a source coupled to receive the ground supply voltage, and a gate coupled to receive a logic high control signal when the interface circuit is configured as an input circuit.

2. The interface circuit of claim 1, wherein said reference voltage circuit comprises:

a one-shot circuit coupled to receive a control signal having a logic high state when the interface circuit is configured as an input circuit, and having a logic low state when the interface circuit is configured as an output circuit, said one-shot circuit providing a brief pull-down voltage to said third PMOS transistor when the control signal switches from a logic low state to a logic high state, wherein said one-shot improves the recovery time of the interface circuit.

3. The interface circuit of claim 1, wherein when a voltage on said I/O pin is less than 5.5 Volts, the positive supply voltage is approximately 3.3 Volts, and the voltage drop across the gate to bulk, gate to drain and gate to source of any of said plurality of transistors is less than 3.6 Volts.

4. An interface circuit that is configurable to form an input circuit or an output circuit of an integrated circuit that operates in response to a positive supply voltage and a around supply voltage, the interface circuit comprising:

an input/output (I/O) pin for providing a connection to an external circuit;

a pull-up structure for pulling up a voltage on said I/O pin;

a pull-down structure for pulling down a voltage on said I/O pin;

an impedance control circuit for providing control signals to the pull-up and pull-down structures, wherein the control signals disable the pull-up and pull-down structures when the interface circuit is configured as an input circuit, and wherein the control signals enable one of the pull-up and pull-down structures and disable the other one of the pull-up and pull-down structures when the interface circuit is configured as an output circuit;

a pull-up protection structure for protecting said pull-up structure from a voltage on said I/O pin greater than the positive supply voltage when the interface circuit is configured as an input circuit;

a pull-down protection structure for protecting said pull-down structure from a voltage on said I/O pin greater than the positive supply voltage when the interface circuit is configured as an input circuit;

a reference voltage circuit for providing an intermediate voltage to said pull-up protection structure when the interface circuit is configured as an input circuit, the intermediate voltage being less than the positive supply voltage and greater than a around supply voltage, the intermediate voltage enabling the pull-up protection structure to protect the pull-up structure from voltages on the I/O pin that are greater than the positive supply voltage;

wherein said pull-up structure comprises:

a first PMOS transistor having a source coupled to receive the positive supply voltage, a drain coupled to the pull-up protection structure, and a gate coupled to receive a control signal from the impedance control circuit;

a second PMOS transistor having a source coupled to the drain of the first PMOS transistor and a drain coupled to the I/O pin;

voltage control circuitry coupled to a gate of the second PMOS transistor;

said pull-down structure comprises an NMOS transistor having a source coupled to receive the ground supply voltage, a drain coupled to the pull-down protection structure, and a gate coupled to receive a control signal from the impedance control circuit; and further comprising:

a well region in which said first and second PMOS transistors are located; and a well pull-up transistor for connecting said well region to said I/O pin when a voltage applied to said I/O pin is greater than the positive supply voltage.

5. The interface circuit of claim 4, wherein said well region is isolated from direct connection to voltage supply terminals providing the positive supply voltage.

6. The interface circuit of claim 4, wherein said insolation circuit further comprises a well pull-up switch having a current carrying terminal coupled to said I/O pin, another current carrying terminal coupled to said well region, and a control terminal coupled to receive said positive supply voltage.

7. An interface circuit that is configurable to form an input circuit or an output circuit of an integrated circuit that operates in response to a positive supply voltage and a around supply voltage, the interface circuit comprising:

an input/output (I/O) pin for providing a connection to an external circuit;

a pull-up structure for pulling up a voltage on said I/O pin;

a pull-down structure for pulling down a voltage on said I/O pin;

an impedance control circuit for providing control signals to the pull-up and pull-down structures, wherein the control signals disable the pull-up and pull-down structures when the interface circuit is configured as an input circuit, and wherein the control signals enable one of the pull-up and pull-down structures and disable the other one of the pull-up and pull-down structures when the interface circuit is configured as an output circuit;

a pull-up protection structure for protecting said pull-up structure from a voltage on said I/O pin greater than the positive supply voltage when the interface circuit is configured as an input circuit;

a pull-down protection structure for protecting said pull-down structure from a voltage on said I/O pin greater than the positive supply voltage when the interface circuit is configured as an input circuit;

a reference voltage circuit for providing an intermediate voltage to said pull-up protection structure when the interface circuit is configured as an input circuit, the intermediate voltage being less than the positive supply voltage and greater than a ground supply voltage, the intermediate voltage enabling the pull-up protection structure to protect the pull-up structure from voltages on the I/O pin that are greater than the positive supply voltage;

wherein the reference voltage circuit includes a one-shot circuit for briefly providing to the pull-up protection structure the ground supply voltage when the interface circuit switches from being an output circuit to being an input circuit.

* * * * *